United States Patent
Chuang et al.

(10) Patent No.: US 11,255,797 B2
(45) Date of Patent: Feb. 22, 2022

(54) STRONTIUM TETRABORATE AS OPTICAL GLASS MATERIAL

(71) Applicant: KLA Corporation, Milpitas, CA (US)

(72) Inventors: Yung-Ho Alex Chuang, Cupertino, CA (US); Yinying Xiao-Li, San Jose, CA (US); Elena Loginova, Campbell, CA (US); John Fielden, Los Altos, CA (US)

(73) Assignee: KLA Corporation, Milpitas, CA (US)

( * ) Notice: Subject to any disclaimer, the term of this patent is extended or adjusted under 35 U.S.C. 154(b) by 0 days.

(21) Appl. No.: 16/921,738

(22) Filed: Jul. 6, 2020

(65) Prior Publication Data
US 2021/0010948 A1 Jan. 14, 2021

Related U.S. Application Data

(60) Provisional application No. 62/871,887, filed on Jul. 9, 2019.

(51) Int. Cl.
*G01N 21/95* (2006.01)
*G02B 27/10* (2006.01)
(Continued)

(52) U.S. Cl.
CPC ..... *G01N 21/9501* (2013.01); *G01N 21/8806* (2013.01); *G02B 1/113* (2013.01);
(Continued)

(58) Field of Classification Search
CPC ........... G01N 21/9501; G01N 21/8806; G02B 27/10; G02B 1/113; G02B 5/08;
(Continued)

(56) References Cited

U.S. PATENT DOCUMENTS 5,608,526 A 3/1997 Piwonka-Corle et al.
5,999,310 A 12/1999 Shafer et al.
(Continued)

FOREIGN PATENT DOCUMENTS

CA 1089641 A 11/1980
CA 2975960 A1 8/2016
(Continued)

OTHER PUBLICATIONS

Tou Ying Lim, H. Wagiran, R. Hussin, S. Hashim; Thermoluminescence Response of Dysprosium Doped Strontium Tetraborate Glasses Subjected to Electron Irradiations; Applied Radiation and Isotopes 102 (2015) 10-14; Published Apr. 14, 2015 (Year: 2015).*
(Continued)

*Primary Examiner* — Roy M Punnoose
(74) *Attorney, Agent, or Firm* — Suiter Swantz pc llo

(57) ABSTRACT

Strontium tetraborate can be used as an optical material. Strontium tetraborate exhibits high refractive indices, high optical damage threshold, and high microhardness. The transmission window of strontium tetraborate covers a very broad range of wavelengths, from 130 nm to 3200 nm, making the material particularly useful at VUV wavelengths. An optical component made of strontium tetraborate can be incorporated in an optical system, such as a semiconductor inspection system, a metrology system, or a lithography system. These optical components may include mirrors, lenses, lens arrays, prisms, beam splitters, windows, lamp cells or Brewster-angle optics.

11 Claims, 3 Drawing Sheets

(51) Int. Cl.
*G02B 1/113* (2015.01)
*G01N 21/88* (2006.01)
*G03F 7/20* (2006.01)
*G02B 5/08* (2006.01)
*G02B 3/00* (2006.01)
*G02B 5/30* (2006.01)

(52) U.S. Cl.
CPC ............ *G02B 27/10* (2013.01); *G02B 3/0006* (2013.01); *G02B 5/08* (2013.01); *G02B 5/3066* (2013.01); *G03F 7/70616* (2013.01)

(58) Field of Classification Search
CPC ...... G02B 3/0006; G02B 5/3066; G02B 1/02; G03F 7/70616; G03F 7/70958
USPC ...................................................... 356/237.5
See application file for complete search history.

(56) References Cited

U.S. PATENT DOCUMENTS

| | | |
|---|---|---|
| 6,297,880 B1 | 10/2001 | Rosencwaig et al. |
| 7,250,460 B1 | 7/2007 | Takamura |
| 7,474,461 B2 | 1/2009 | Chuang et al. |
| 7,525,649 B1 | 4/2009 | Leong et al. |
| 7,705,331 B1 | 4/2010 | Kirk et al. |
| 7,817,260 B2 | 10/2010 | Chuang et al. |
| 7,957,066 B2 | 6/2011 | Varmstrong et al. |
| 8,711,470 B2 | 4/2014 | Armstrong |
| 9,080,971 B2 | 7/2015 | Kandel et al. |
| 9,152,008 B1 | 10/2015 | Armstrong |
| 9,228,943 B2 | 1/2016 | Wang et al. |
| 9,255,887 B2 | 2/2016 | Brunner |
| 9,279,774 B2 | 3/2016 | Romanovsky et al. |
| 9,470,639 B1 | 10/2016 | Zhuang et al. |
| 9,645,287 B2 | 5/2017 | Brunner |
| 9,709,510 B2 | 7/2017 | Kolchin et al. |
| 9,723,703 B2 | 8/2017 | Bezel et al. |
| 9,726,617 B2 | 8/2017 | Kolchin et al. |
| 9,753,352 B1 | 9/2017 | Armstrong |
| 9,865,447 B2 | 1/2018 | Chuang et al. |
| 9,891,177 B2 | 2/2018 | Vazhaeparambil et al. |
| 10,651,619 B2 | 5/2020 | Trull-Silvestre et al. |
| 10,921,261 B2 * | 2/2021 | Chuang .................. G02B 5/283 |
| 2005/0218812 A1 | 10/2005 | Brakel et al. |
| 2006/0103315 A1 | 5/2006 | Vossen et al. |
| 2007/0173580 A1 | 7/2007 | Takamura |
| 2011/0076504 A1 | 3/2011 | Van De Weerdt et al. |
| 2013/0077086 A1 | 3/2013 | Chuang et al. |
| 2018/0034227 A1 | 2/2018 | Trull-Silvestre et al. |

FOREIGN PATENT DOCUMENTS

| | | |
|---|---|---|
| CN | 102597159 B | 9/2015 |
| CN | 107567669 A | 1/2018 |
| CN | 107573929 A | 1/2018 |
| CN | 110068979 A | 7/2019 |
| CN | 107573929 B | 8/2019 |
| CN | 110068979 B | 4/2020 |
| EP | 2130844 A1 | 12/2009 |
| EP | 3062075 A1 | 8/2016 |
| EP | 2288632 B1 | 4/2017 |
| FR | 2539555 A1 | 7/1984 |
| FR | 2559672 A1 | 8/1985 |
| RU | 2103425 C1 | 1/1998 |
| WO | 2009147007 A2 | 12/2009 |
| WO | 2009147007 A3 | 2/2010 |
| WO | 2010015980 A1 | 2/2010 |
| WO | 2011156091 A1 | 12/2011 |
| WO | 2016125002 A1 | 8/2016 |

OTHER PUBLICATIONS

Ma, Z. et al., "Strain-induced improvements on linear and nonlinear opticalproperties of SrB4O7 crystal", AIP Advances, 2012, vol. 2, pp. 032170-032171~6the whole document, 7 pages.

PCT International Search Report and Written Opinion for International Application No. PCT/US2020/041091 dated Nov. 5, 2020, 7 pages.

Shankar, M. V. et al., "Dielectric and optical characteristics of strontiumtetraborate glasses", Journal of materials science letters, 1996, vol. 15, pp. 858-860, abstract; p. 859, 3 pages.

Shankar, M. V. et al., "Dielectrical and optical characteristics of strontium tetraborate glasses", Journal of Materials Science Letters, 15 (1996), pp. 858-860.

Oseledchik, Y. S. et al., "New nonlinear optical crystals: strontium and lead tetraborates," Opt. Mater. 4, 669 (1995), pp. 669-674.

Perloff, A. et al., "The crystal structure of the strontium and lead tetraborates, SrO.2B2O3 and PbO.2B2O3," Acta Cryst. 20, pp. 274-279 (1966)).

Yavetskiy, R.P. et al., "Preparation of surface-crystallized optical glass-ceramics SrO 2B2O3," Glass Phys Chem 35, 389-396 (2009).

* cited by examiner

STRONTIUM TETRABORATE AS OPTICAL GLASS MATERIAL

CROSS-REFERENCE TO RELATED APPLICATIONS

The present application claims priority to U.S. Provisional Patent Application No. 62/871,887, filed Jul. 9, 2019, entitled STRONTIUM TETRABORATE AS OPTICAL MATERIAL, naming Yung-Ho Alex Chuang, Yinying Xiao-Li, Elena Loginova, and John Fielden as inventors, which is incorporated herein by reference in the entirety.

TECHNICAL FIELD

The present disclosure relates generally to optical glass materials. In particular, the disclosure relates to an optical glass material, strontium tetraborate ($SrB_4O_7$), for linear optical components such as mirrors, lenses, prisms, beam splitters, windows and lamp cells suitable for use in metrology and inspection systems in semiconductor manufacturing, including those used to inspect and/or measure photomasks, reticles, and semiconductor wafers.

BACKGROUND

The integrated circuit industry requires inspection tools with increasingly higher sensitivity to detect ever smaller defects and particles whose sizes may be a few tens of nanometers (nm), or less. These inspection tools must operate at high speed in order to inspect a large fraction, or even 100%, of the area of a photomask, reticle, or wafer, in a short period of time. For example, inspection time may be one hour or less for inspection during production or, at most, a few hours for R&D or troubleshooting. In order to inspect so quickly, inspection tools use pixel or spot sizes larger than the dimensions of the defect or particle of interest, and detect just a small change in signal caused by a defect or particle. Detecting a small change in signal requires a high light level and a low noise level. High speed inspection is most commonly performed in production using inspection tools operating with ultraviolet (UV) light. Inspection in R&D may be performed with UV light or with electrons.

The integrated circuit (IC) industry also requires high precision metrology tools for accurately measuring the dimensions of small features down to a few nanometers or less on semiconductor wafers. Metrology processes are performed on wafers at various points in a semiconductor manufacturing process to measure a variety of characteristics of the wafers such as a width of a patterned structure on the wafer, a thickness of a film formed on the wafer, and overlay of patterned structures on one layer of the wafer with respect to patterned structures on another layer of the wafer. These measurements are used to facilitate process controls and/or yield efficiencies in the manufacture of semiconductor dies. Metrology may be performed with UV light or with electrons.

The semiconductor industry, which is aimed at producing integrated circuits with higher integration, lower power consumption and lower costs, is one of the main drivers of UV optics. The development of powerful UV light sources such as the excimer lasers and frequency multiplied solid state lasers has led to the growth of research and development efforts in the field of UV photon applications.

Optical glasses are used in many applications such as cameras, telescopes, microscopes, binoculars, virtual reality systems, semiconductor systems, among others. Optical glasses are ubiquitous in semiconductor inspection and metrology. They are found in most inspection and metrology systems in optical parts such as mirrors, lenses, prisms, beam splitters, windows and lamp cells.

Optical glasses in the deep ultraviolet (DUV), from approximately 200 nm to 280 nm, and vacuum ultraviolet (VUV), from approximately 100 nm to 200 nm, spectral ranges are challenging. DUV and VUV lasers may have high power levels from several milli-watts (mW) to ten or more watts (W) and high photon energy (e.g., 6.5 eV at 193 nm and 4.66 eV at 266 nm). Pulsed lasers may have short pulse lengths (e.g., ns or less) and high repetition rates (e.g., tens of kHz or greater). Optical glasses, in addition to being transparent in the DUV/VUV wavelength ranges, need to withstand these extreme conditions with high optical damage threshold, high hardness and good stability.

There are a few glass materials known in the art suitable for DUV and VUV wavelengths. Among them, the most widely and commonly used is fused silica, which is known by trade names such as Suprasil, Spectrosil, Lithosil, etc. Fused silica is widely used due to cheap production since it is made from quartz and exhibits good thermal dimensional stability and durability. However, fused silica can only operate down to 190 nm in wavelength and most grades have a UV cutoff around 200 nm or longer. Optical parts made of fused silica are often smaller than 100 mm due to the difficulty of finding UV grade blanks of that size or larger. Fused silica also has an absorption dip around 240 nm, which makes it a poor choice for light sources operating in this region. In addition, the internal structure of fused silica glass can be disrupted by long exposure to strong UV light.

Calcium fluoride ($CaF_2$) is another common UV glass material. $CaF_2$ is transparent from 130 nm to nearly 10 μm and has a low refractive index (n~1.46) in the UV. Most fluorides are hygroscopic, that is, they absorb water from the atmosphere. As a result, UV performance will decrease over time when exposed to the atmosphere. Water will absorb the UV light, and the absorption will cause a volume change leading to stresses and potential changes in shape. Furthermore, intense UV radiation can accelerate reaction of water and oxygen with calcium fluoride. $CaF_2$ material is soft and brittle, and it chips easily during polishing. It is difficult to achieve high curvature and good surface roughness together. $CaF_2$ also requires extensive cleanings between lapping because particles from the lapping process can get trapped and rebonded to the surface creating increased scattering sites and decreased overall performance.

Magnesium fluoride ($MgF_2$) has a similar transmission window as $CaF_2$. $MgF_2$ is also the most common coating material for UV optics. Unlike $CaF_2$, $MgF_2$ performance is not affected by water. However, $MgF_2$ has a low optical damage threshold (~0.1 $GW/cm^2$). Also, since $MgF_2$ is ionic it may not withstand high voltages. In addition, $MgF_2$ is birefringent and may not be appropriate for certain applications. When $MgF_2$ is exposed to ultraviolet radiation, absorption may cause transmission to drop and it gets worse over time.

The damage thresholds of all the above materials are reduced by impurities or defects in the material. These impurities and defects can create color centers that absorb DUV and/or VUV radiation. Color centers can grow under exposure to VUV or DUV radiation causing transmission of UV wavelengths to decrease over time.

While significant interest in producing stable glass materials under VUV and DUV illuminations has existed for several decades, there are only a few choices for optical glass materials in the DUV and VUV wavelength ranges.

For the present application of high-speed inspection and metrology, optical glasses need to have high optical damage thresholds, significant hardness and good stability. It is further desired that such glasses have low permeability to diffusion of water and oxygen in order to reduce oxidation.

Therefore, an optical glass material that overcomes some, or all, of the limitations discussed above is desired.

SUMMARY

A linear optical component comprising strontium tetraborate ($SrB_4O_7$) is disclosed, in accordance with one or more embodiments of the present disclosure.

An optical system is disclosed, in accordance with one or more embodiments of the present disclosure. In one illustrative embodiment, the optical system includes one or more linear optical components, wherein at least a portion of the one or more linear optical components are formed from strontium tetraborate.

An optical system is disclosed, in accordance with one or more additional and/or alternative embodiments of the present disclosure. In one illustrative embodiment, the optical system includes a stage for supporting a sample. In another illustrative embodiment, the optical system includes an illumination source. In another illustrative embodiment, the optical system includes one or more linear optical components configured to direct illumination from the illumination source to the sample, wherein at least a portion of the one or more linear optical components are formed from strontium tetraborate.

It is to be understood that both the foregoing general description and the following detailed description are exemplary and explanatory only and are not necessarily restrictive of the invention as claimed. The accompanying drawings, which are incorporated in and constitute a part of the specification, illustrate embodiments of the invention and together with the general description, serve to explain the principles of the invention.

BRIEF DESCRIPTION OF THE DRAWINGS

The numerous advantages of the disclosure may be better understood by those skilled in the art by reference to the accompanying figures in which.

DETAILED DESCRIPTION

Figure 1:
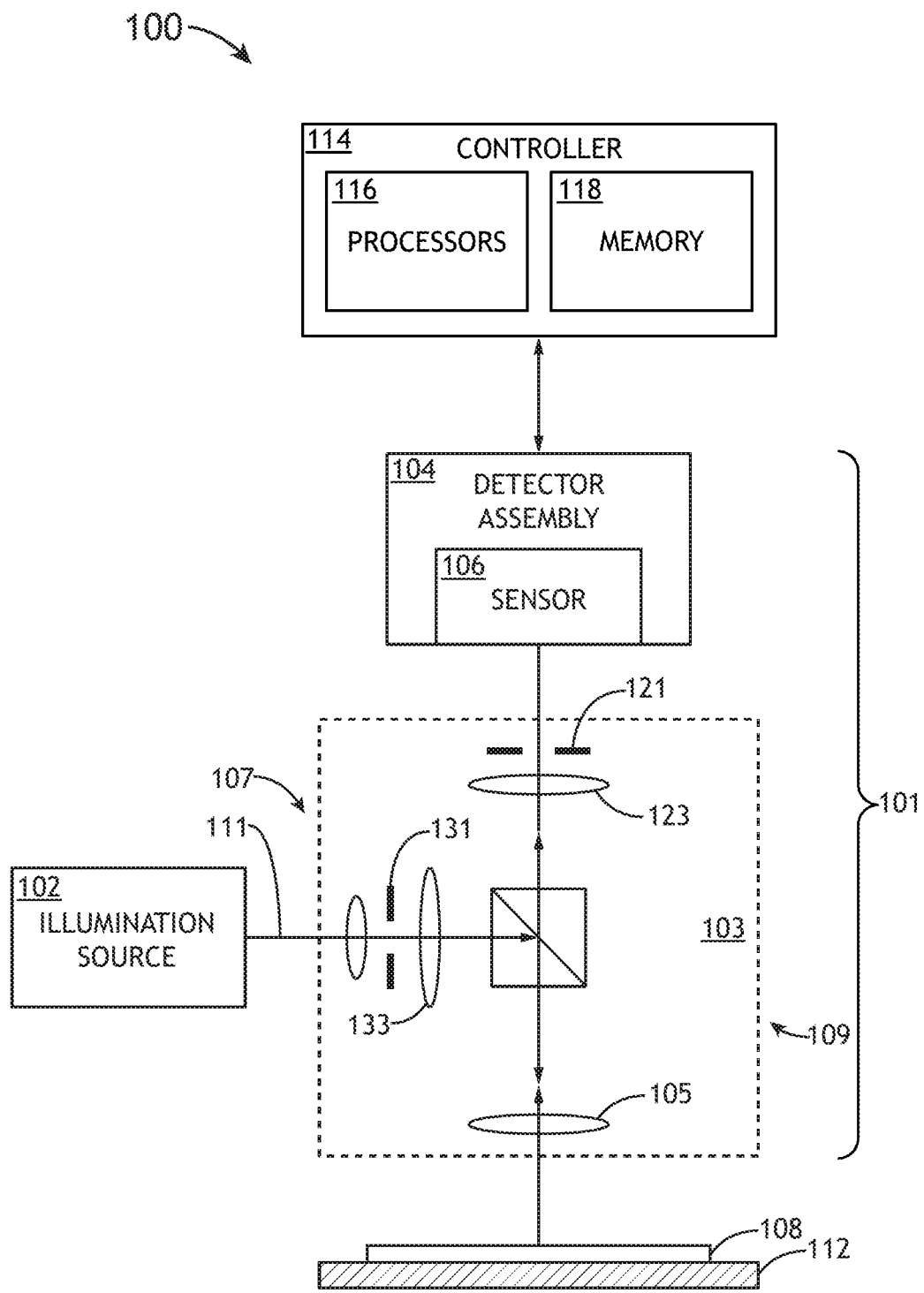
FIG. 1 illustrates a block diagram view of a characterization system, in accordance with one or more embodiments of the present disclosure.

The present disclosure has been particularly shown and described with respect to certain embodiments and specific features thereof. The embodiments set forth herein are taken to be illustrative rather than limiting. It should be readily apparent to those of ordinary skill in the art that various changes and modifications in form and detail may be made without departing from the spirit and scope of the disclosure. Reference will now be made in detail to the subject matter disclosed, which is illustrated in the accompanying drawings.

Embodiments of the present disclosure are directed to the incorporation of strontium tetraborate ($SrB_4O_7$) as an optical glass material within one or more linear optical components of semiconductor inspection and/or metrology systems. For example, embodiments of the present disclosure incorporate $SrB_4O_7$ as an optical glass material in linear optical components found in inspection and metrology systems such as, but not limited to, mirrors, lenses, lens arrays, prisms, beam splitters, windows and lamp cells.

It is noted that $SrB_4O_7$ exhibits unique optical and mechanical properties. The transparency range of $SrB_4O_7$ is 130-3200 nm in wavelength. See Y. S. Oseledchik, A. L. Prosvirnin, A. I. Pisarevskiy, V. V. Starshenko, V. V. Osadchuk, S. P. Belokrys, N. V. Svitanko, A. S. Korol, S. A. Krikunov, and A. F. Selevich, "New nonlinear optical crystals: strontium and lead tetraborates," Opt. Mater. 4, 669 (1995), which is incorporated by reference herein in the entirety. This broad transmission window makes $SrB_4O_7$ a good candidate for optical glass material especially for the DUV and VUV wavelength ranges. If $SrB_4O_7$ is grown in optimal conditions, the transmittance can reach more than 80% for wavelengths longer than 200 nm and more than 50% for 130 nm to 200 nm. The refractive indices of $SrB_4O_7$ are high compared with other glass materials such as $CaF_2$. For example, the refractive indices at 266 nm are 1.7883 in the x direction, 1.7909 in the y direction and 1.7936 in the z direction. Note that the differences among these refractive indices are relatively small; thus, birefringence effects may be small in components fabricated from crystalline $SrB_4O_7$. $SrB_4O_7$ is not hygroscopic, and since borate is an oxide, it is resistant to further oxidation if oxygen or water is present during exposure to DUV or VUV radiation. The optical damage threshold is very high (14.7 $GW/cm^2$) compared with other glass materials. The surface laser-induced damage threshold of $SrB_4O_7$ is about 16 $J/cm^2$, which is much higher than that of fused silica and calcium fluoride. The microhardness of $SrB_4O_7$ is also high (1750 $kg/mm^2$ in the x direction, 1460 $kg/mm^2$ in the y direction and 1350 $kg/mm^2$ in the z direction). The high optical damage threshold and microhardness allow $SrB_4O_7$ glasses to withstand extreme conditions when exposed to DUV and VUV radiation. DUV and VUV lasers may have high power levels from several milli-watts (mW) to several watts (W) or more, and high photon energy (for example 6.5 eV at 193 nm and 4.66 eV at 266 nm). Pulsed lasers may have short pulse lengths (ns or less) and high repetition rates (tens of kHz or greater).

In accordance with embodiments of the present disclosure, one or more linear optical components made of $SrB_4O_7$ disclosed herein may be incorporated into inspection and metrology systems. Semiconductor inspection tools must operate at high speed in order to inspect a large fraction, or even 100%, of the area of a photomask, reticle, or wafer, in a short period of time. For example, inspection time may be one hour or less for inspection during production or, at most, a few hours for R&D or troubleshooting. In order to inspect so quickly, inspection tools use pixel or spot sizes larger than the dimensions of the defect or particle of interest, and detect just a small change in signal caused by a defect or particle. High speed inspection is most commonly performed in production using inspection tools operating with ultraviolet (UV) light. High precision metrology tools are required for accurately measuring the dimensions of small features down to a few nanometers or less on semiconductor wafers. Metrology processes are performed on wafers at various points in a semiconductor manufacturing process to measure a variety of characteristics of the wafers such as a width of a patterned structure on the wafer, a thickness of a film formed on the wafer, and an overlay offset of patterned structures on one layer of the wafer with respect to patterned structures on another layer of the wafer. These measurements are used to facilitate process controls and/or yield efficiencies in the manufacture of semiconductor dies. High-speed inspection and metrology require high light levels and a stable signal. Optical components are the building blocks of the inspection and metrology systems. Optical glass materials that do not degrade, or degrade more slowly than existing glass materials, can result in a more stable signal making it easier to detect small changes in signal. Such glass materials also can reduce the operating cost of an inspection or metrology tool by reducing the frequency of replacement of optical components.

FIG. 1 illustrates a simplified schematic view of a characterization system 100, in accordance with one or more embodiments of the present disclosure. In one embodiment, the characterization system 100 (or "tool") includes a characterization sub-system 101 and a controller 114. The characterization system 100 may be configured as an inspection system or a metrology system. For example, the characterization system 100 may be an optical-based inspection system (or "tool"), a review system (or "tool"), or an image-based metrology system (or "tool"). In this regard, the characterization sub-system 101 may be, but is not limited to, an inspection sub-system or a metrology sub-system configured to inspect or measure a sample 108. The characterization sub-system 101 of the characterization system 100 may be communicatively coupled to the controller 114. The controller 114 may receive measurement data from a detector assembly 104 of the characterization sub-system in order to characterize (e.g., inspect or measure) a structure on or in sample 108 and/or control one or more portions of the characterization system 100.

Sample 108 may include any sample known in the art such as, but not limited to, a wafer, reticle, photomask, or the like. In one embodiment, the sample 108 may be disposed on a stage assembly 112 to facilitate movement of the sample 108. The stage assembly 112 may include any stage assembly known in the art including, but not limited to, an X-Y stage, an R-θ stage, and the like. In another embodiment, the stage assembly 112 is capable of adjusting the height of the sample 108 during inspection to maintain focus on the sample 108. In yet another embodiment, characterization sub-system 101 may be moved up and down during inspection to maintain focus on the sample 108.

In another embodiment, the characterization system 100 includes an illumination source 102 configured to generate an illumination beam 111. The illumination source 102 may include any illumination source known in the art suitable for generating an illumination beam 111. For example, the illumination source 102 may emit near infrared (NIR) radiation, visible radiation, ultraviolet (UV) radiation, near UV (NUV), deep UV (DUV) radiation, vacuum UV (VUV) radiation, and the like. For instance, the illumination source 102 may include one or more lasers. In another instance, the illumination source 102 may include a broadband illumination source.

In another embodiment, the characterization system 100 includes an illumination arm 107 configured to direct illumination from the illumination source 102 to the sample 108. The illumination arm 107 may include any number and type of optical components known in the art. In one embodiment, the illumination arm 107 includes one or more optical elements 103. In this regard, illumination arm 107 may be configured to focus illumination from the illumination source 102 onto the surface of the sample 108. It is noted herein that the one or more optical elements 103 may include any optical element know in the art including, but not limited to, one or more lenses (e.g., an objective lens 105), one or more mirrors, one or more polarizers, one or more prisms, one or more beam splitters, and the like.

In another embodiment, a collection arm 109 is configured to collect illumination reflected, scattered, diffracted, and/or emitted from the sample 108. In another embodiment, the collection arm 109 may direct and/or focus the illumination from the sample 108 to a sensor 106 of a detector assembly 104. It is noted herein that sensor 106 and the detector assembly 104 may include any sensor and detector assembly 104 known in the art. It is noted that detector assembly 118 may include any sensor and detector assembly known in the art. The sensor may include, but is not limited to, a charge-coupled device (CCD detector), a complementary metal oxide semiconductor (CMOS) detector, a time-delay integration (TDI) detector, a photomultiplier tube (PMT), an avalanche photodiode (APD), a line sensor, an electron-bombarded line sensor, or the like.

In another embodiment, the detector assembly 104 is communicatively coupled to one or more processors 116 of the controller 114. The one or more processors 116 may be communicatively coupled to memory 118. The one or more processors 116 are configured to execute a set of program instructions stored in memory 118 for acquiring measurement data from the one or more sensors 106 of the detector assembly 104 and/or controlling one or more portions of the characterization system 100.

In one embodiment, the characterization system 100 illuminates a line on sample 108 and collects scattered and/or reflected illumination in one or more dark-field and/or bright-field collection channels. In this embodiment, detector assembly 104 may include a line sensor or an electron-bombarded line sensor.

In one embodiment, illumination source 102 is a continuous source. For example, the illumination source 102 may include, but is not limited to, an arc lamp, a laser-pumped plasma light source, or a continuous wave (CW) laser. In another embodiment, illumination source 102 is a pulsed source. For example, the illumination source 102 may include, but is not limited to, a mode-locked laser, a Q-switched laser, or a plasma light source pumped by a mode-locked or Q-switched laser. Examples of suitable light sources that may be included in illumination source 102 are described in U.S. Pat. No. 7,705,331, entitled "Methods and systems for providing illumination of a specimen for a process performed on the specimen", to Kirk et al., U.S. Pat. No. 9,723,703, entitled "System and method for transverse pumping of laser-sustained plasma", to Bezel et al., and U.S. Pat. No. 9,865,447, entitled "High brightness laser-sustained plasma broadband source", to Chuang et al, which are each incorporated by reference herein.

In one embodiment, the one or more optical elements 103 includes an illumination tube lens 133. The illumination tube lens 133 may be configured to image an illumination pupil aperture 131 to a pupil within the objective lens 105. For example, the illumination tube lens 133 may be configured such that the illumination pupil aperture 131 and the pupil within the objective lens 105 are conjugate to one another. In one embodiment, the illumination pupil aperture 131 may be configurable by switching different apertures into the location of illumination pupil aperture 131. In another embodiment, the illumination pupil aperture 131 may be configurable by adjusting a diameter or shape of the opening of the illumination pupil aperture 131. In this regard, the sample 108 may be illuminated by different ranges of angles depending on the characterization (e.g., measurement or inspection) being performed under control of the controller 114.

In one embodiment, the one or more optical elements 103 include a collection tube lens 123. For example, the collection tube lens 123 may be configured to image the pupil within the objective lens 105 to a collection pupil aperture 121. For instance, the collection tube lens 123 may be configured such that the collection pupil aperture 121 and the pupil within the objective lens 105 are conjugate to one another. In one embodiment, the collection pupil aperture 121 may be configurable by switching different apertures into the location of collection pupil aperture 121. In another embodiment, the collection pupil aperture 121 may be configurable by adjusting a diameter or shape of the opening of collection pupil aperture 121. In regard, different ranges of angles of illumination reflected or scattered from the sample 108 may be directed to detector assembly 104 under control of the controller 114.

In another embodiment, the illumination pupil aperture 131 and/or the collection pupil aperture 121 may include a programmable aperture. Programmable apertures are generally discussed in U.S. Pat. No. 9,255,887, entitled "2D programmable aperture mechanism," to Brunner, issued on Feb. 9, 2016; and U.S. Pat. No. 9,645,287, entitled "Flexible optical aperture mechanisms," to Brunner, issued on May 9, 2017, both of which are herein incorporated by reference in the entirety. Methods of selecting an aperture configuration for inspection is generally described in U.S. Pat. No. 9,709,510, entitled "Determining a configuration for an optical element positioned in a collection aperture during wafer inspection," to Kolchin et al., issued on Jul. 18, 2017; and U.S. Pat. No. 9,726,617, entitled "Apparatus and methods for finding a best aperture and mode to enhance defect detection," to Kolchin et al, issued on Aug. 8, 2017, both of which are herein incorporated by reference in the entirety.

In one embodiment, one or more linear optical components of the optics 103 and/or the illumination source 102 are formed from $SrB_4O_7$. The linear optical components herein may include mirrors, lenses, lens arrays, prisms, beam splitters, windows and/or lamp cells. The overall light throughput of system 100 may be improved by appropriately using $SrB_4O_7$ as the optical glass material for one or more linear optical components. The lifetime of key linear optical components may also be improved by using $SrB_4O_7$. A linear optical component may be fabricated from a single $SrB_4O_7$ crystal, or from $SrB_4O_7$ glass. It is noted that glass versions of the $SrB_4O_7$ linear optical components may be weaker (lower damage threshold, lower microhardness) than a corresponding single crystal form $SrB_4O_7$ optical component. Nevertheless, $SrB_4O_7$ glass is adequately robust for many applications. It is further noted that $SrB_4O_7$ glass possesses the additional advantage of displaying no birefringence. Thus, $SrB_4O_7$ glass may be implemented in settings where no birefringence is required (e.g., high numerical aperture lenses). In cases where the birefringence effects are minor (e.g., low numerical aperture lenses) or desirable (e.g., a polarizing beam splitter), single crystal $SrB_4O_7$ may be implemented and has the advantage of higher resistance to damage than glass.

In one embodiment, illumination beam 111 is polarized, for example, as in light generated by a laser. In this embodiment at least one of the one or more linear optical components of the optics 103 and the illumination source 102 is configured to operate substantially at Brewster's angle relative to the polarization direction of illumination beam 111. For example, the one or more linear optical components may include one of Brewster's angle wavefront processing optics, a Brewster's angle lens, a Brewster's angle dual wavelength waveplate, and harmonic separation optics with a Brewster's angle input surface. Since the refractive index of $SrB_4O_7$ is higher than most other optical materials, there may be no suitable material to use as an antireflection coating on $SrB_4O_7$ especially at DUV and VUV wavelengths. An advantage of optics configured to operate at Brewster's angle is that the reflectivity will be low without using any antireflection coating. Furthermore, antireflection coatings tend to be susceptible to damage when operated under high UV intensity. Avoiding an antireflection coating allows optical components fabricated from $SrB_4O_7$ to fully benefit from the high damage threshold of $SrB_4O_7$. It is noted that the reflectivity of a surface is low for angles close to Brewster's angle. Deviations of a few degrees (such as about 2° or less) of the orientation of the surface from Brewster's angle result in very low reflectivity. Brewster's angle for $SrB_4O_7$ crystals is about 60.5±1° over a wide range of visible and UV wavelengths. Because of this, Brewster's angle optics fabricated from $SrB_4O_7$ may be used with polarized broad-band light as well as with laser light. More details of optics configured to operate at Brewster's angle can be found in U.S. Pat. Nos. 8,711,470, 9,152,008 and 9,753,352, all entitled "High Damage Threshold Frequency Conversion System", and all to Armstrong, which are incorporated herein by reference in their entirety.

Characterization systems are generally described in U.S. Pat. No. 9,891,177, entitled "TDI Sensor in a Darkfield System", to Vazhaeparambil et al., issued on Feb. 13, 2018; U.S. Pat. No. 9,279,774, entitled "Wafer Inspection", to Romanovsky et al., issued on Mar. 8, 2018; U.S. Pat. No. 7,957,066, entitled "Split Field Inspection System Using Small Catadioptric Objectives," to Armstrong et al., issued on Jun. 7, 2011; U.S. Pat. No. 7,817,260, entitled "Beam Delivery System for Laser Dark-Field Illumination in a Catadioptric Optical System," to Chuang et al., issued on Oct. 19, 2010; U.S. Pat. No. 5,999,310, entitled "Ultra-Broadband UV Microscope Imaging System with Wide Range Zoom Capability," to Shafer et al., issued on Dec. 7, 1999; U.S. Pat. No. 7,525,649, entitled "Surface Inspection System Using Laser Line Illumination with Two Dimensional Imaging," to Leong et al., issued on Apr. 28, 2009; U.S. Pat. No. 9,080,971, entitled "Metrology Systems and Methods," to Kandel et al., issued on Jul. 14, 2015; U.S. Pat. No. 7,474,461, entitled "Broad Band Objective Having Improved Lateral Color Performance," to Chuang et al., issued on Jan. 6, 2009; U.S. Pat. No. 9,470,639, entitled "Optical Metrology With Reduced Sensitivity To Grating Anomalies," to Zhuang et al., issued on Oct. 18, 2016; U.S. Pat. No. 9,228,943, entitled "Dynamically Adjustable Semiconductor Metrology System," to Wang et al., issued on Jan. 5, 2016; U.S. Pat. No. 5,608,526, entitled "Focused Beam Spectroscopic Ellipsometry Method and System," to Piwonka-Corle et al., issued on Mar. 4, 1997; and U.S. Pat. No. 6,297,880, entitled "Apparatus for Analyzing Multi-Layer Thin Film Stacks on Semiconductors," to Rosencwaig et al., issued on Oct. 2, 2001, all of which are incorporated herein by reference in the entirety.

It is noted that the scope of the present disclosure is not limited to the characterization system 100. Rather, the system incorporating the $SrB_4O_7$ optics of the present disclosure may include any other optical system known in the art including a lithographic system/tool.

It is noted herein that the one or more components of system 100 may be communicatively coupled to the various other components of system 100 in any manner known in the art. For example, the one or more processors 116 may be communicatively coupled to each other and other components via a wireline (e.g., copper wire, fiber optic cable, and the like) or wireless connection (e.g., RF coupling, IR coupling, WiMax, Bluetooth, 3G, 4G, 4G LTE, 5G, and the like).

The one or more processors 116 may include any one or more processing elements known in the art. In this sense, the one or more processors 116 may include any microprocessor-type device configured to execute software algorithms and/or instructions. The one or more processors 116 may consist of a desktop computer, mainframe computer system, workstation, image computer, parallel processor, or other computer system (e.g., networked computer) configured to execute a program configured to operate the system 100, as described throughout the present disclosure. It should be recognized that the steps described throughout the present disclosure may be carried out by a single computer system or, alternatively, multiple computer systems. Furthermore, it should be recognized that the steps described throughout the present disclosure may be carried out on any one or more of the one or more processors 116. In general, the term "processor" may be broadly defined to encompass any device having one or more processing elements, which execute program instructions from memory 118. Moreover, different subsystems of the system 100 (e.g., illumination source 102, detector assembly 104, controller 114, and the like) may include processor or logic elements suitable for carrying out at least a portion of the steps described throughout the present disclosure. Therefore, the above description should not be interpreted as a limitation on the present disclosure but merely an illustration.

The memory 118 may include any storage medium known in the art suitable for storing program instructions executable by the associated one or more processors 116 and the data received from the metrology sub-system and/or inspection sub-system. For example, the memory 118 may include a non-transitory memory medium. For instance, the memory 118 may include, but is not limited to, a read-only memory (ROM), a random-access memory (RAM), a magnetic or optical memory device (e.g., disk), a magnetic tape, a solid-state drive and the like. It is further noted that memory 118 may be housed in a common controller housing with the one or more processors 116. In an alternative embodiment, the memory 118 may be located remotely with respect to the physical location of the processors 116, controller 114, and the like. In another embodiment, the memory 118 maintains program instructions for causing the one or more processors 116 to carry out the various steps described through the present disclosure.

Figure 2:
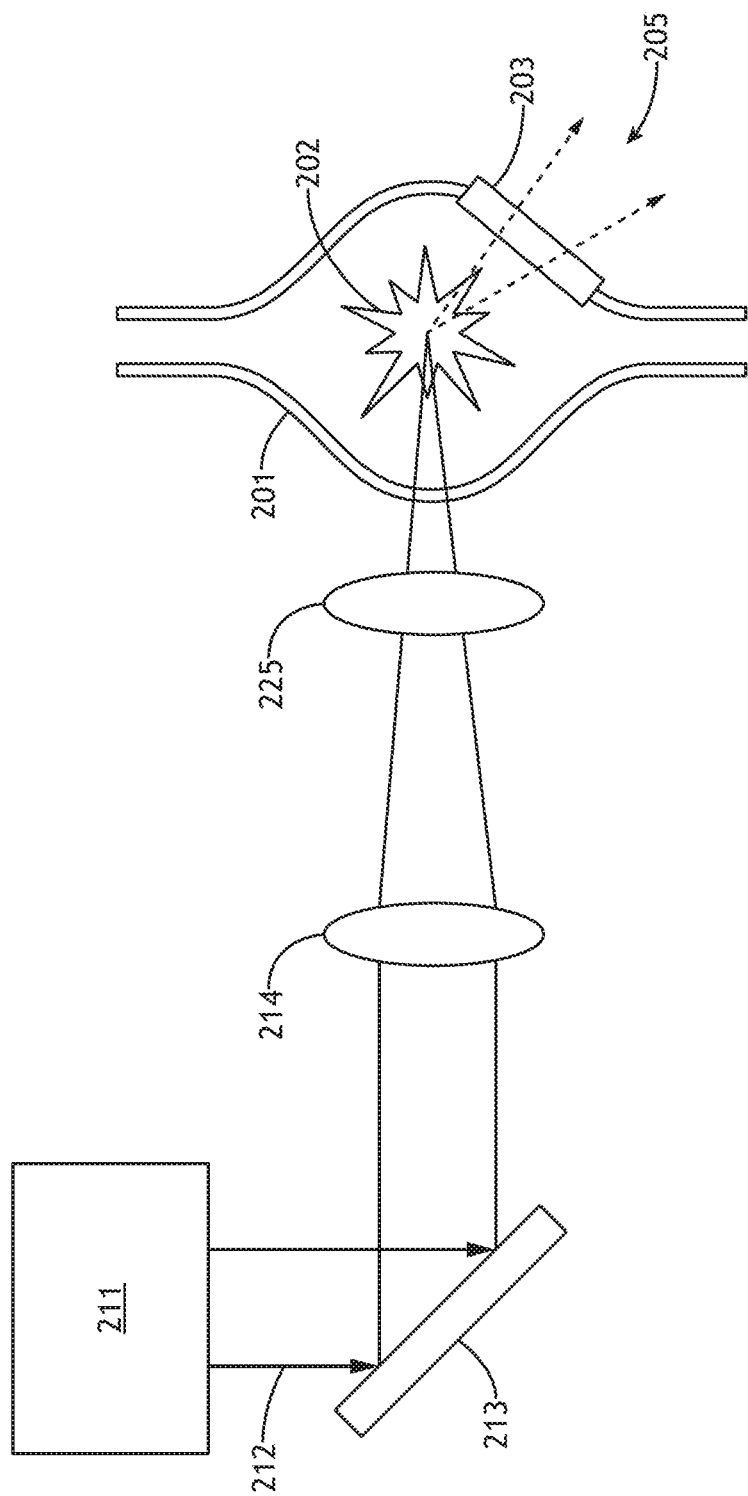
FIG. 2 illustrates an ultraviolet lamp incorporating $SrB_4O_7$ as an optical glass material for one or more optical components, in accordance with one or more embodiments of the present disclosure.

FIG. 2 illustrates a simplified schematic view of an ultraviolet lamp that incorporates $SrB_4O_7$ as an optical glass material for one or more optical components, in accordance with one or more embodiments of the present disclosure. The ultraviolet lamp may be a laser-driven light source. In this example, a laser 211 emits laser beam 212, which is directed by mirror 213 and focused by lens 214 and lens 225 and generates a plasma 202 inside a lamp cell 201. The plasma 202 emits broadband ultraviolet light 205 over a broad range of wavelengths including DUV wavelengths and/or VUV wavelengths. One or more windows 203 may be placed in a wall of the lamp cell 201 to enable broadband ultraviolet light 205 to be transmitted out of lamp cell 201. In one embodiment, the lamp cell 201 may be made of $SrB_4O_7$. In this embodiment, $SrB_4O_7$ may be used to form a transparent bulb, which contains the gas for generating plasma 202. In another embodiment, the one or more windows 203 may be formed from $SrB_4O_7$. In yet another embodiment, both the lamp cell 201 and the one or more windows 203 may be made of $SrB_4O_7$. The overall light throughput of ultraviolet lamp may be improved by appropriately using $SrB_4O_7$ as the optical glass material for one or more optical components. The lifetime of ultraviolet lamp and key optical components may also be improved by using $SrB_4O_7$. Any of the aforementioned optical components may be fabricated with $SrB_4O_7$ crystal or glass and the scope of the present disclosure is not at all limited to the $SrB_4O_7$-based windows or plasma cells. Rather, as discussed previously herein, any number of linear optical components of the present disclosure may be formed from $SrB_4O_7$ and may be implemented in any optical context, which may include, but is not limited to, semiconductor inspection or metrology.

$SrB_4O_7$ crystallizes in the orthorhombic system, $P2_1$ nm, with unit cell dimensions a=4.237 Å, b=4.431 Å, and c=10.706 Å (A. Perloff, and S. Block, "The crystal structure of the strontium and lead tetraborates, $SrO.2B_2O_3$ and $PbO.2B_2O_3$," Acta Cryst. 20, 274-279 (1966)). All boron atoms are coordinated tetrahedrally and an oxygen atom is common to three tedrahedra. Despite the three-dimensional network of tetrahedral, the borate network appears as a layer-like structure since there are relatively fewer links in the c direction of the unit cell.

Figure 3:
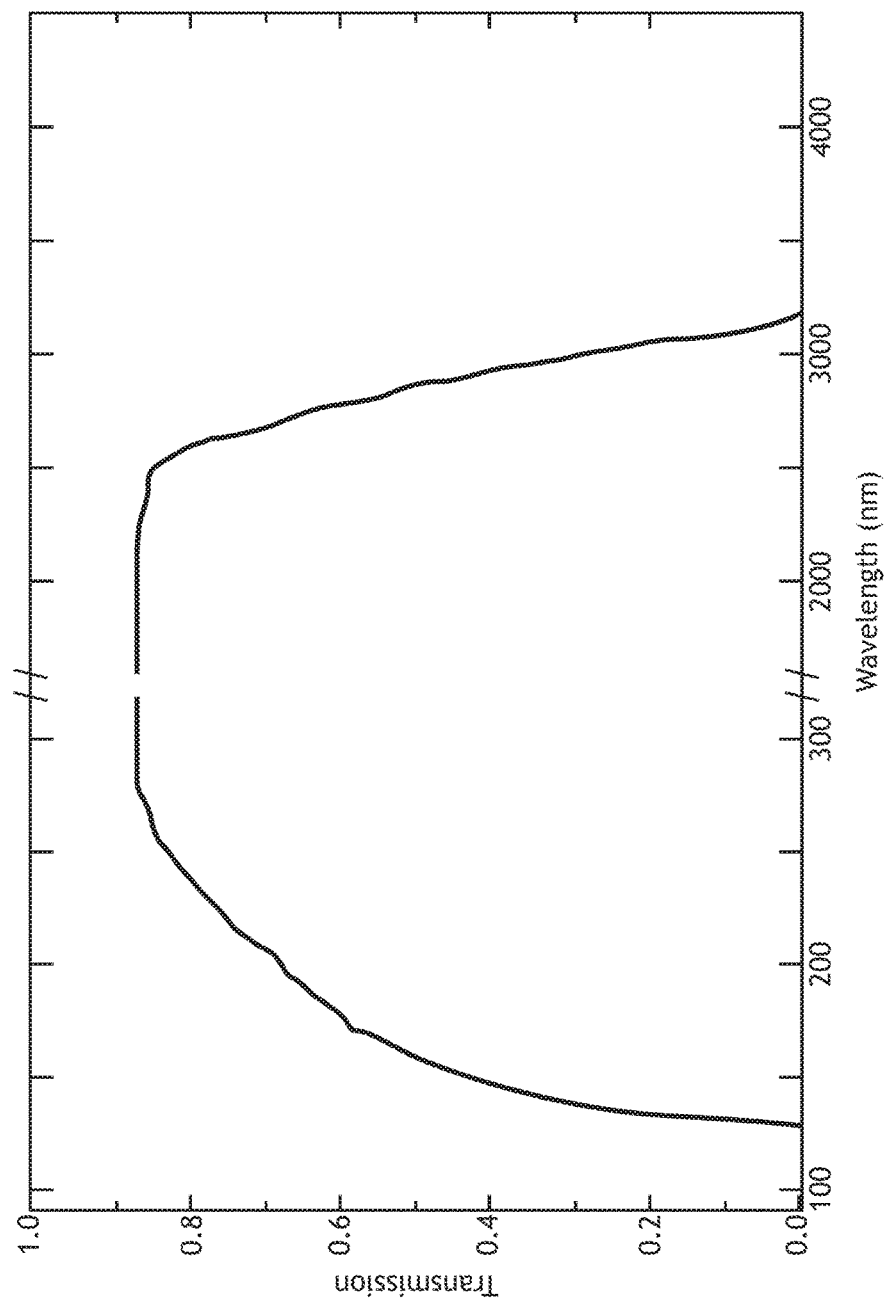
FIG. 3 illustrates a typical transmission curve of $SrB_4O_7$.

FIG. 3 illustrates a typical transmission curve 300 of $SrB_4O_7$ (Y. S. Oseledchik, A. L. Prosvirnin, A. I. Pisarevskiy, V. V. Starshenko, V. V. Osadchuk, S. P. Belokrys, N. V. Svitanko, A. S. Korol, S. A. Krikunov, and A. F. Selevich, "New nonlinear optical crystals: strontium and lead tetraborates," Opt. Mater. 4, 669 (1995)). As shown in transmission curve 300, the transparency range of $SrB_4O_7$ is very broad, namely from about 130 nm to about 3200 nm, which covers VUV, DUV, visible, and near infrared (IR) wavelength ranges. The VUV and DUV ranges are of particular interest to semiconductor inspection and metrology. It is also noted that the transmittance is high. For instance, the transmittance exceeds 80% from about 250 nm to about 2500 nm. This high transmittance makes $SrB_4O_7$ a good candidate for optical glass materials especially for the UV wavelength range. If $SrB_4O_7$ is grown in optimal conditions, a better transmission curve can be obtained: the transmittance can reach more than 80% for wavelengths longer than 200 nm and more than 50% for 130 nm to 200 nm. Dielectric and optical properties of strontium tetraborate glasses are described by M. V. Shankar and K. B. R. Varma in "Dielectric and Optical Properties of Strontium Tetraborate Glass," Journal of Materials Science Letters 15 (1996) 858-860, which is incorporated herein by reference in the entirety.

Various modifications to the described embodiments will be apparent to those with skill in the art, and the general principles defined herein may be applied to other embodiments. Although it is expected that the optical glass material disclosed herein will be particularly useful in semiconductor inspection and metrology systems, it is also envisioned that these glass materials may be useful in other applications where VUV and DUV radiation are present, such as in an optical lithography system, and where high intensity visible or IR radiation is present, such as in an IR light source or camera system.

The glass material and methods described herein are not intended to be limited to the particular embodiments shown and described but are to be accorded the widest scope consistent with the principles and novel features herein disclosed.

One skilled in the art will recognize that the herein described components, operations, devices, objects, and the discussion accompanying them are used as examples for the sake of conceptual clarity and that various configuration modifications are contemplated. Consequently, as used herein, the specific exemplars set forth and the accompanying discussion are intended to be representative of their more general classes. In general, use of any specific exemplar is intended to be representative of its class, and the non-inclusion of specific components, operations, devices, and objects should not be taken as limiting.

The previous description is presented to enable one of ordinary skill in the art to make and use the invention as provided in the context of a particular application and its requirements. As used herein, directional terms such as "top," "bottom," "over," "under," "upper," "upward," "lower," "down," and "downward" are intended to provide relative positions for purposes of description, and are not intended to designate an absolute frame of reference. Various modifications to the described embodiments will be apparent to those with skill in the art, and the general principles defined herein may be applied to other embodiments. Therefore, the present invention is not intended to be limited to the particular embodiments shown and described, but is to be accorded the widest scope consistent with the principles and novel features herein disclosed.

With respect to the use of substantially any plural and/or singular terms herein, those having skill in the art can translate from the plural to the singular and/or from the singular to the plural as is appropriate to the context and/or application. The various singular/plural permutations are not expressly set forth herein for sake of clarity.

The herein described subject matter sometimes illustrates different components contained within, or connected with, other components. It is to be understood that such depicted architectures are merely exemplary, and that in fact many other architectures can be implemented which achieve the same functionality. In a conceptual sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "connected," or "coupled," to each other to achieve the desired functionality, and any two components capable of being so associated can also be viewed as being "couplable," to each other to achieve the desired functionality. Specific examples of couplable include but are not limited to physically mateable and/or physically interacting components and/or wirelessly interactable and/or wirelessly interacting components and/or logically interacting and/or logically interactable components.

Furthermore, it is to be understood that the invention is defined by the appended claims. It will be understood by those within the art that, in general, terms used herein, and especially in the appended claims (e.g., bodies of the appended claims) are generally intended as "open" terms (e.g., the term "including" should be interpreted as "including but not limited to," the term "having" should be interpreted as "having at least," the term "includes" should be interpreted as "includes but is not limited to," and the like). It will be further understood by those within the art that if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to inventions containing only one such recitation, even when the same claim includes the introductory phrases "one or more" or "at least one" and indefinite articles such as "a" or "an" (e.g., "a" and/or "an" should typically be interpreted to mean "at least one" or "one or more"); the same holds true for the use of definite articles used to introduce claim recitations. In addition, even if a specific number of an introduced claim recitation is explicitly recited, those skilled in the art will recognize that such recitation should typically be interpreted to mean at least the recited number (e.g., the bare recitation of "two recitations," without other modifiers, typically means at least two recitations, or two or more recitations). Furthermore, in those instances where a convention analogous to "at least one of A, B, and C, and the like" is used, in general such a construction is intended in the sense one having skill in the art would understand the convention (e.g., "a system having at least one of A, B, and C" would include but not be limited to systems that have A alone, B alone, C alone, A and B together, A and C together, B and C together, and/or A, B, and C together, and the like). In those instances where a convention analogous to "at least one of A, B, or C, and the like" is used, in general such a construction is intended in the sense one having skill in the art would understand the convention (e.g., "a system having at least one of A, B, or C" would include but not be limited to systems that have A alone, B alone, C alone, A and B together, A and C together, B and C together, and/or A, B, and C together, and the like). It will be further understood by those within the art that virtually any disjunctive word and/or phrase presenting two or more alternative terms, whether in the description, claims, or drawings, should be understood to contemplate the possibilities of including one of the terms, either of the terms, or both terms. For example, the phrase "A or B" will be understood to include the possibilities of "A" or "B" or "A and B."

What is claimed:

1. An optical system comprising:
    a stage for supporting a sample;
    a light source; and
    one or more linear optical components configured to direct light from the light source to the sample, wherein at least a portion of the one or more linear optical components are formed from strontium tetraborate.

2. The optical system of claim 1, wherein the strontium tetraborate comprises a glass phase.

3. The optical system of claim 1, wherein the one or more linear optical components comprise at least one of a mirror, a lens, a lens array, a prism, a beam splitter, a window, or a lamp cell.

4. The optical system of claim 1, wherein at least one of the one or more linear optical components is configured to operate substantially at Brewster's angle relative to a direction of polarization of light incident on said at least one of the one or more linear optical components.

5. The optical system of claim 1, wherein the light source is configured to emit light having a wavelength within a range from 130 nm to 400 nm.

6. The optical system of claim 1, wherein the light source is a broadband ultraviolet lamp comprising at least one of a window or a lamp cell, wherein at least a portion of the at least one of the window or the lamp cell is formed from strontium tetraborate.

7. The optical system of claim 6, wherein the broadband ultraviolet lamp is configured to emit a wavelength within a range from 130 nm to 400 nm.

8. The optical system of claim 1, wherein the optical system is configured as a semiconductor characterization system.

9. The optical system of claim 8, wherein the optical system comprises at least one of a semiconductor inspection system or a semiconductor metrology system.

10. The optical system of claim 8, wherein the optical system comprises:
   a sensor, wherein the one or more linear optical components formed from strontium tetraborate are configured to direct light reflected or scattered from the sample to the sensor.

11. The optical system of claim 1, wherein the optical system comprises a lithographic system.

\* \* \* \* \*